United States Patent [19]

Schiller et al.

[11] Patent Number: 4,665,297
[45] Date of Patent: May 12, 1987

[54] HIGH POWER ELECTRON GUN

[75] Inventors: Siegfried Schiller; Guenter Jaesch; Alexander von Ardenne, all of Dresden, German Democratic Rep.

[73] Assignee: Bakish Materials Corporation, Englewood, N.J.

[21] Appl. No.: 851,650

[22] Filed: Apr. 14, 1986

[30] Foreign Application Priority Data

May 31, 1985 [DD] German Democratic Rep. .................................. 2768456

[51] Int. Cl.$^4$ .............................................. B23K 15/00
[52] U.S. Cl. .............................................. 219/121 ET
[58] Field of Search ............... 219/121 ET, 121 ER, 219/121 ES, 121 EB, 121 EM; 313/146, 155

[56] References Cited

FOREIGN PATENT DOCUMENTS 112879 5/1975 German Democratic Rep. .
132380 9/1978 German Democratic Rep. .
134168 2/1979 German Democratic Rep. .

Primary Examiner—C. L. Albritton
Attorney, Agent, or Firm—Nolte, Nolte and Hunter

[57] ABSTRACT

A high beam power electron gun of the axial type, particularly useful in large-scale vacuum metallurgy plants for melting, vaporizing and heat treating. The electron gun is controllable over its entire power range, i.e., from 10% to 100% of its nominal power, while the focal length of its beam guidance lens is maintained unchanged. This lens is downstream of a cathode, a focusing electrode and a movable anode, and is provided on its upstream side with a pole shoe to which the anode is fastened and which, together with the anode, is movable as a single unit in the axial direction for controlling the power.

4 Claims, 1 Drawing Figure

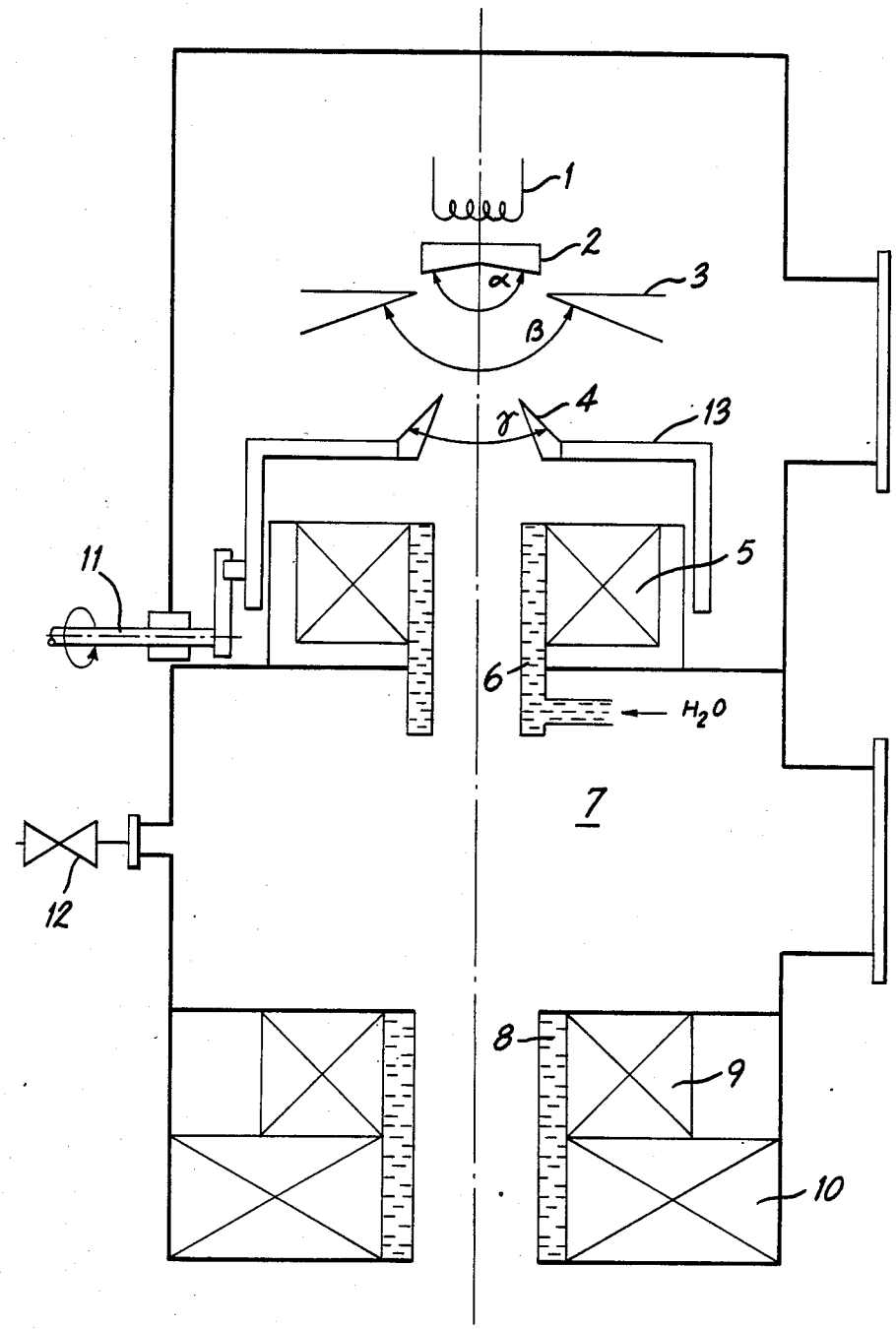

HIGH POWER ELECTRON GUN

BACKGROUND OF THE INVENTION

This invention relates to electron guns and, more particularly, to an axial-type electron gun for generating an electron beam having very high power and high power density, applicable in large-scale vacuum metallurgy plants for melting, vaporizing and heat treatment.

Axial-type electron guns are known which generate electron beams and have nominal powers ranging from 60 kW to 1,200 kW. For improving beam generating reliability, it has been proposed in German Democratic Republic Pat. No. 112,879 to design a focusing electrode of an electron gun in such a manner that the potential of the focusing electrode is equal to, or smaller than, the potential of the filament used to indirectly heat a solid cathode of the electron gun. Furthermore, it has been disclosed in German Democratic Republic Pat. No. 132,380 that high power electron beams can be guided with improved quality by utilizing gas focusing.

It has, moreover, become known that a high power electron gun has, to some extent, a good operating condition if its electron beam is generated as a result of space charge limited emission of its cathode. More specifically, with sufficient cathode heating, the power of the electron beam can be controlled by varying the acceleration voltage. However, if the acceleration voltage is varied, all electric and magnetic fields necessary for guiding and positioning the electron beam must be readjusted accordingly. A technique for eliminating this drawback has been proposed in German Democratic Republic Pat. No. 134,168 and utilizes an axially adjustable anode, the adjustment of which controls electron beam power notwithstanding a constant acceleration voltage and a constant cathode temperature.

Enroute to its target, the electron beam of an electron gun typically passes, inter alia, an anode and a subsequent magnetic lens (beam guidance lens). In an electron-optical sense, the anode passageway represents a dispersion lens, but the beam guidance lens corresponds to a condensing lens. The expert knows and can prove by the electron-optical laws of imagery that the generally realized combination of an axially adjustable anode with a fixed beam guidance lens has both advantages and disadvantages. In this case, it is advantageous that a definite focal length of the fixed beam guidance lens can be chosen independently of the adjusted position of the anode, whereas it is disadvantageous that the aperture of the electron beam increases with increasing cathode-to-anode distance. Furthermore, the expert knows and can prove by the electron-optical laws of imagery that a beam guidance lens moved together with an axially adjustable anode has advantages and disadvantages, too. In this case, it is advantageous that the aperture of the electron beam decreases with increasing cathode-to-anode distance, whereas it is disadvantageous that the focal length of the beam guidance lens must be made greater for optimally concentrating the electron beam.

SUMMARY OF THE INVENTION

It is an object of the invention to surmount the disadvantages of prior art electron guns capable of generating high power electron beams.

To this end, the invention is based on the task of creating a powerful electron gun having a nominal power in the range of from 60 kW to more than 1,200 kW, the electron beam of which results from a space charge limited emission current and the power of which can be controlled by means of an axially adjustable anode. Another prerequisite is that the electron beam shall be generated within the whole controllable power range, e.g., from 10% to 100% of the nominal power of the electron gun, using a definite focal length of a beam guidance lens without increasing the aperture of the electron beam. Thus, only the respective advantages of a fixed beam guidance lens and of an axially adjustable beam guidance lens are to be utilized while excluding their respective disadvantages.

According to the invention, the aforesaid task is solved by providing an electron gun operated with a constant acceleration voltage, the gun including an axially adjustable anode with a cone angle of from 60° to 120°, a cathode with a cone angle of from 140° to 170° and a focusing electrode with a cone angle of from 130° to 160°, the gun utilizing gas focusing of the electron beam, wherein the anode and a pole shoe of the beam guidance lens form one unit which is axially movable at the side of the beam guidance lens proximate to the cathode and focusing electrode.

Surprisingly, it was found that this arrangement, contrary to theoretical predictions, combines solely the advantages of a fixed beam guidance lens and of an axially adjustable beam guidance lens.

Quite clearly, the improved guidance of the electron beam by means of the described invention finds its basis in the cooperation of the axially adjustable anode, the specified geometrical conditions in the region where the electron beam is generated and the utilization of gas focusing for the electron beam.

For enhancing the reliability of the system, it is advantageous if the anode is of a high temperature resistant material and if the movable pole shoe of the beam guidance lens, which carries the anode, is without water cooling.

Furthermore, in order to maintain in the anode region the necessary pressure of from $1 \cdot 10^{-4}$ to $3 \cdot 10^{-4}$ Torr for gas focusing of the electron beam, it is advantageous to flange-connect an external regulating valve to an intermediate chamber of the electron gun.

BRIEF DESCRIPTION OF THE DRAWING

The sole FIGURE is a diagrammatic sectional view in elevation of an axial-type electron gun embodying the invention.

DETAILED DESCRIPTION OF THE INVENTION

As diagrammatically depicted in the drawing, the axial-type electron gun is provided with a filament 1 for indirectly heating an adjacent solid cathode 2 to an electron emission temperature. Cathode 2 is followed in succession by a focusing electrode 3, an anode 4 and a magnetic beam guidance lens 5. A first beam guidance tube 6, functioning as a water-cooled flow resistor, is intimately encircled by beam guidance lens 5 and partially extends in an axial direction into a chamber 7 intermediate beam guidance lens 5 and a second beam guidance tube 8, functioning as a water-cooled flow resistor, intimately encircled by a magnetic beam adjusting lens 9 and a magnetic deflection system 10 which are disposed in stacked relation to one another.

A rotary, feed-through eccentric drive 11 is operatively connected to an axially movable pole shoe 13 of cup-like configuration disposed about the outer circumference of beam guidance lens 5 in magnetically coupled relation thereto. Pole shoe 13 is centrally apertured to accommodate a fixed mounting thereon of anode 4, so that anode 4 and pole shoe 13 form one unit at the side of beam guidance lens 5 which is proximate cathode 2 and focusing electrode 3, this unitary structure 4, 13 being axially movable by operation of eccentric drive 11 from a location externally of the electron gun.

For setting a constant pressure within intermediate chamber 7 by which the necessary gas focusing pressure of from $1 \cdot 10^{-4}$ to $3 \cdot 10^{-4}$ Torr can be maintained in the space occupied by anode 4, a suitable external regulating valve 12 is flange-connected to intermediate chamber 7.

Solid cathode 2 is conically dished toward anode 4 with a cone angle $\alpha$ of from 140° to 170°, the drawing showing a cathode cone angle of 160° within this range. Focusing electrode 3 defines a conically diverging, axially oriented, downstream passageway for the electrons emitted by cathode 2, and has a cone angle $\beta$ of from 130° to 160°, the drawing showing a focusing electrode cone angle of 140° within this range. Anode 4 provides an axially oriented passageway through which is accelerated the focused beam of electrons from focusing electrode 3, the anode passageway having a conical outer sidewall converging in the direction of focusing electrode 3 and defining the anode cone angle $\gamma$ which is from 60° to 120°, the drawing showing an anode cone angle of 90° within this range. The inner sidewall of the anode passageway also conically converges in the direction of focusing electrode 3, but at a non-critical, lesser angle relative to anode cone angle $\gamma$.

Through energization of filament 1, cathode 2 is heated up to an emission temperature of such a high value that a space charge limited stream of electrons is drawn therefrom by a constant acceleration voltage applied between cathode 2 and anode 4 by conventional means (not shown). With the aid of focusing electrode 3, the electron beam is formed and passes through anode 4 into the region of first beam guidance tube 6. Beam guidance lens 5 permits low loss guidance of the electron beam through beam guidance tubes 6 and 8. The local and temporal adjustment of the power density at the target results from beam adjusting lens 9 and deflection system 10, respectively.

Due to the maintenance of the pressure from $1 \cdot 10^{-4}$ to $3 \cdot 10^{-4}$ Torr in the space occupied by anode 4, the electron beam produces a plasma which effects its gas (ionic) focusing. Control of electron beam power is effected by adjusting the axial position of anode 4 with eccentric drive 11 until the required beam current is obtained. The focal length of beam guidance lens 5 remains unchanged and the electron beam aperture is not increased by the positional adjustment of anode 4.

The invention claimed is:

1. In a high beam power electron gun of the axial type, comprising a cathode having a cone angle $\alpha$ of from 140° to 170°, a focusing electrode having a cone angle $\beta$ of from 130° to 160° and an axially movable anode having a cone angle $\gamma$ of from 60° to 120°, a magnetic beam guidance lens for axially guiding an electron beam passing through said anode and formed with the aid of said focusing electrode from electrons emitted by said cathode, and means for maintaining a pressure of from $1 \cdot 10^{-4}$ to $3 \cdot 10^{-4}$ Torr in the region of said electron gun occupied by said anode, the improvement wherein said magnetic beam guidance lens (5) is provided with an axially movable pole shoe (13) telescoped thereover and having said anode (4) fixedly mounted thereon in a region of said electron gun lying between said focusing electrode (3) and said magnetic beam guidance lens (5), and wherein means (11) are provided for axially moving said pole shoe (13), thereby simultaneously to move axially said anode (4) fixedly mounted on said pole shoe (13).

2. A high beam power electron gun of the axial type according to claim 1, wherein said anode (4) is constituted by a material having high temperature resistance.

3. A high beam power electron gun of the axial type according to claim 1, wherein said magnetic beam guidance lens (5) is non-watercooled.

4. A high beam power electron gun of the axial type according to claim 1, wherein a control valve (12) is externally connected to an intermediate chamber (7) of said electron gun for setting the pressure in said region occupied by said anode (4), said intermediate chamber (7) being disposed immediately downstream of said magnetic beam guidance lens (5).

* * * * *